United States Patent
Lieb et al.

(10) Patent No.: US 6,634,910 B2
(45) Date of Patent: Oct. 21, 2003

(54) ELECTRIC APPLIANCE COMPRISING MODULES THAT CAN BE JUXTAPOSED

(75) Inventors: Gerald Lieb, Kernen (DE); Othmar Gaidosch, Ostfildern (DE); Bernd Fischer, Plochingen (DE)

(73) Assignee: Hirschmann Electronics GmbH & Co. KG, Neckartenzlingen (DE)

( * ) Notice: Subject to any disclaimer, the term of this patent is extended or adjusted under 35 U.S.C. 154(b) by 44 days.

(21) Appl. No.: 10/088,261

(22) PCT Filed: Mar. 2, 2001

(86) PCT No.: PCT/EP01/02355
§ 371 (c)(1),
(2), (4) Date: Mar. 18, 2002

(87) PCT Pub. No.: WO01/69995
PCT Pub. Date: Sep. 20, 2001

(65) Prior Publication Data
US 2002/0182942 A1 Dec. 5, 2002

(30) Foreign Application Priority Data
Mar. 11, 2000 (DE) .......................... 100 11 354

(51) Int. Cl.[7] .................................. H01R 9/22
(52) U.S. Cl. ............... 439/715; 439/505; 439/76.1; 439/512; 439/709; 439/717; 439/949; 439/928; 439/507; 439/271; 439/283
(58) Field of Search .................... 439/715, 505–510, 439/716, 512, 513, 76.1, 949, 952, 928, 709, 710, 717, 271, 278, 281, 283

(56) References Cited

U.S. PATENT DOCUMENTS

| | | | | |
|---|---|---|---|---|
| 5,581,130 A | * | 12/1996 | Boucheron | 307/10.1 |
| 5,641,313 A | * | 6/1997 | Hohorst | 439/709 |
| 5,674,098 A | * | 10/1997 | Inaba et al. | 439/883 |
| 6,062,914 A | * | 5/2000 | Fasano | 439/716 |
| 6,081,048 A | * | 6/2000 | Bergmann et al. | 307/147 |
| 6,475,036 B2 | * | 11/2002 | Morikawa | 439/716 |
| 6,527,599 B2 | * | 3/2003 | Bechtold et al. | 439/736 |

FOREIGN PATENT DOCUMENTS

| | | |
|---|---|---|
| DE | 42 24 155 A1 | 2/1994 |
| DE | 93 20 414.0 | 11/1994 |
| DE | 296 07 525 U1 | 8/1996 |
| DE | 297 03 367 U1 | 10/1998 |

\* cited by examiner

*Primary Examiner*—P. Austin Bradley
*Assistant Examiner*—Truc Nguyen
(74) *Attorney, Agent, or Firm*—Fulbright & Jaworski, LLP

(57) ABSTRACT

An electric appliance (1) comprising modules (2, 3) that can be juxtaposed to one another and interconnected using bridge elements (4) for transmitting electric signals and operating voltages. The modules (2, 3) and bridge elements (4) are provided with a pair of plug-in connectors (31) and also a pair of mating plug-in connectors (25, 26). The plug-in connectors (31) are each mounted in a cylindrical outer sleeve (36), and the mating plug-in connectors (25, 26) are mounted in cylindrical ducts or penetrations (19). An O-shaped sealing ring or gasket (38) is arranged about the circumference of each outer sleeve (36), so that the O-shaped gaskets (38) are under pressure when the outer sleeves (36) are inserted in the penetration (19) to interconnect the plug-in connectors (31) and the mating plug-in connectors (25, 26).

40 Claims, 2 Drawing Sheets

ELECTRIC APPLIANCE COMPRISING MODULES THAT CAN BE JUXTAPOSED

BACKGROUND OF THE INVENTION

1. Field of the Invention

The present invention relates to an electrical apparatus with juxtaposable modules which can be electrically connected to one another by bridge elements. More particularly, the present invention relates to providing reliable connections between juxtaposable modules and bridge elements using at least recesses with insertable sleeves and interposing sealing gaskets.

2. Description of the Related Technology

Prior Art apparatuses, as are known for example from DE 297 03 367 U1 are often used as subscriber devices in bus systems for control and monitoring of technical processes using sensors and actuators that can be connected to the modules via apparatus connectors.

To seal the connecting site between the bridge elements and the modules, in the prior art the interfitting parts are made interlocking. One such version however, due to the required production precision, dictates high production costs. Nevertheless the attainable sealing effect is poor. To improve it, therefore in the known apparatus there is an additional seal, for example, a flat seal, as is used in the apparatus known from DE 296 07 525 U1, which when the bridge elements are inserted into the modules in the insertion direction, are pressed against the bottom part of blind recesses which is used as a contact carrier in the module housing. To produce the pressure required for this purpose, in the known apparatus, there are threaded screws which are pushed through the holes of the bridge elements and can be screwed into threaded holes in the modular housing. Without this screw attachment the bridge elements, especially when these apparatuses are used on machines, would not be positionally stable and the contact-making of the connectors would not be resistant to vibrations.

SUMMARY OF THE INVENTION

The object of the invention is to devise an electrical device of the initially mentioned type in which the connections for the bridge elements and the modules have a permenance which meets high requirements (degree of protection IP 67) in a simple and economical manner, and the disconnection force is as high as possible and vibration-resistant, and the interconnection of the connectors is ensured without additional fasteners.

This object is achieved by using at least recesses with insertable sleeves and interposing sealing gaskets.

By use of a cylindrical shape for penetrations, both economical and effective O-shaped gaskets, e.g. rings, can be used as the sealing devices; the O-shaped gaskets achieve their sealing force which acts essentially in the radial direction at a constant distance from the contact surfaces solely by their dimensions and material properties and do not require any additional features, such as more compression, or contact surfaces such as abutments. Moreover, the O-shaped gaskets can be very easily installed by being slipped onto the outside sleeves surrounding connectors or the mating connectors and do not need to be inserted into a blind recess or into grooves at the bottom part of blind recesses, as in the apparatus known from DE 297 03 367 U1.

In addition, the penetrations can be produced much more economically than blind recesses. Bur mainly the penetrations and the pertinent contact carriers can be located on separate parts of the electrical apparatus; this greatly simplifies both production and installation and enables versatile use. The penetrations are made either in the module housings or in the bridge elements, the pertinent contact carriers thereby independently can be included for example on circuit boards within the modules or bridge elements.

Furthermore, the outside sleeves which bear the O-shaped gasket are not form-fitted to the walls of the penetrations either, by which production is greatly simplified and more economical.

The compressing force of the gasket for appropriate selection and dimensioning of the distances of the contact surfaces is so great that forces for insertion and extraction of up to 10 kg are reached and thus in general no special additional features are necessary for sealing the attachment of the bridge elements. This has the advantage not only of a significant reduction in production and installation costs, but also easier handling, since the bridge elements, for example for replacement of modules in case of servicing, can be slipped on and withdrawn by hand.

By having an insertable outside sleeve integral with the bridge unit or the module housing, without additional sealing features, ensures tightness also at the insertion sites of the outside sleeve into the respective penetration.

By incorporation of an oblique arrangement of the contact surfaces for the O-shaped gasket, without any additional costs an increase of the insertion and withdrawal forces up to roughly 15 kg which is independent of the O-shaped gasket composition and the relevant dimensions can be achieved, because the compression force of the gasket that is directed perpendicular to the contact surfaces includes a force component arising from insertion due to the tilt of the contact surfaces. As a result of this increased withdrawal force on the one hand and the vibration-damping action of the elastic gasket on the other the resulting electrical apparatus is suited for mounting on the mounting surfaces of highly vibrating machines without additional fastening devices.

One version of the module housing that provides structural dimensions comparable to those of the bridge element and also includes plug-and-socket connections on the module housing for actuators, sensors and a field bus enables a very compact apparatus with a low structural height which can also be used in many applications where there is little space available for installation.

By way of a partition extending from the module housing with a crosspiece, provides, if necessary, support for the bridge elements slight tilting which is possible in extreme cases or in case of unintentional bumping so that for these cases reliable sealing and a high withdrawal force are achieved. The dimensions are chosen such that the cited compactness of the module housing is preserved. This embodiment can be accomplished essentially without additional costs by one-piece production.

Another very simple and feasible embodiment of the apparatus of the present invention, has T-shaped projections and corresponding guide slots extend from the module housing so that the modules can be attached to one another by hand (and if necessary can be detached from one another). Exact guidance of the projections into the slots moreover ensures that the center distances of the modules adjacent to the mating connectors facing one another always corresponds exactly to that of the connectors of the bridge elements, by which exactly centered axial insertion of the connectors into the penetrations and thus optimum sealing and retaining action are ensured.

A console-shaped execution of the module housing has the advantage that the labeling fields and display elements positioned on the oblique console surfaces are easily visible in the arrangement on or under roughly horizontal surfaces but also in a wall mounting. This is the more so when all labeling fields and display elements are located on the tilted console surface.

In another version of the module housing there are mounting feet extending from the module for resting on an installation surface. Between the housing bottom and the mounting surface there is a gap through which air flows (convection flow) which advantageously dissipates the lost heat released from the encapsulated modules. Compared to the prior art according to German utility models 296 07 525 and 297 03 367 in which the modules are located without spacing on the mounting sheets, the operating temperature for the present invention is lower and thus the service life of the modules is increased.

It is especially economical to produce the feet in one piece with the module housing, for example in an injection molding process, and to provide them at the same time with holes for screw attachment of the modules to mounting surfaces.

The convection flow between the housing bottom and the mounting surface and thus also the heat dissipation are especially strong when the housing bottom is made trough-shaped and to taper toward housing end faces.

A further intensification of cooling of the modules can be achieved incorporating elevations (domes) as part of the housing bottom in that housing bottom has a surface as large as possible for heat dissipation, for which especially tubular domes are suited for the elevations (domes). The cross sections of the domes can be made in any shape, for example, square or round.

A grid-like arrangement of these domes, by which corridors which run in the flow direction between the domes are formed, moreover facilitating the dissipation of unwanted lost heat.

A one-piece execution of the domes and housing bottom not only reduces production costs, but also ensures optimum heat transfer from the housing bottom to the dome surfaces.

Overall, a noticeable prolongation of the apparatus service life is achieved by incorporation at lease these features of mounting feet, housing bottom spaced from mounting surfaces, and elevations (domes) integrated as part of housing bottoms.

It is a good idea to use a circuit board for internal line connections and to accommodate electrical switching elements, which the board can be attached in the module housing very easily and economically by a press fit.

Depending on the separation of the assigned mating connectors from their penetrations, the connectors can be mounted on the circuit board and in doing so their contact elements can be connected directly to the pertinent printed conductors of the circuit board without additional connecting lines.

In one advantageous embodiment of the bridge elements a connector to feed an operating voltage independent of the bus lines into the modules is enabled. Conductor cross sections can thus be adapted to [the] feed currents which are desired in the individual case. For example, they can be designed for currents so high that a plurality of sensors and especially actuators can be supplied. This is not possible in the transmission of operating voltages via bus lines, for which reason for example in the apparatus known from DE 296 07 525 U1 requires an additional feed module ASI.

When using bridge elements according to this embodiment of the present the invention, no such device is necessary.

In many applications, for individual actuators and groups of actuators separate operating voltage circuits are desired, for example when the operating voltage for certain actuators in case of a hazard is to be disconnectible on an emergency basis without influencing the remaining subscribers over the bus line. This is enabled by formation of the bridge elements by having only one conductor for the operating voltage, which bridge elements are inserted on the pertinent modules simply and economically. With these bridge elements, flexible adaptation to the different requirements of the individual case is thus achieved with respect to the operating voltage supply. Conversely, in the known apparatuses only a supply of all actuators and sensors is possible.

BRIEF DESCRIPTION OF THE DRAWINGS

The invention is explained below using one embodiment in the form of a field bus subscriber unit according to an alternative shown in the figures.

DETAILED DESCRIPTION OF THE INVENTION

Figure 1:
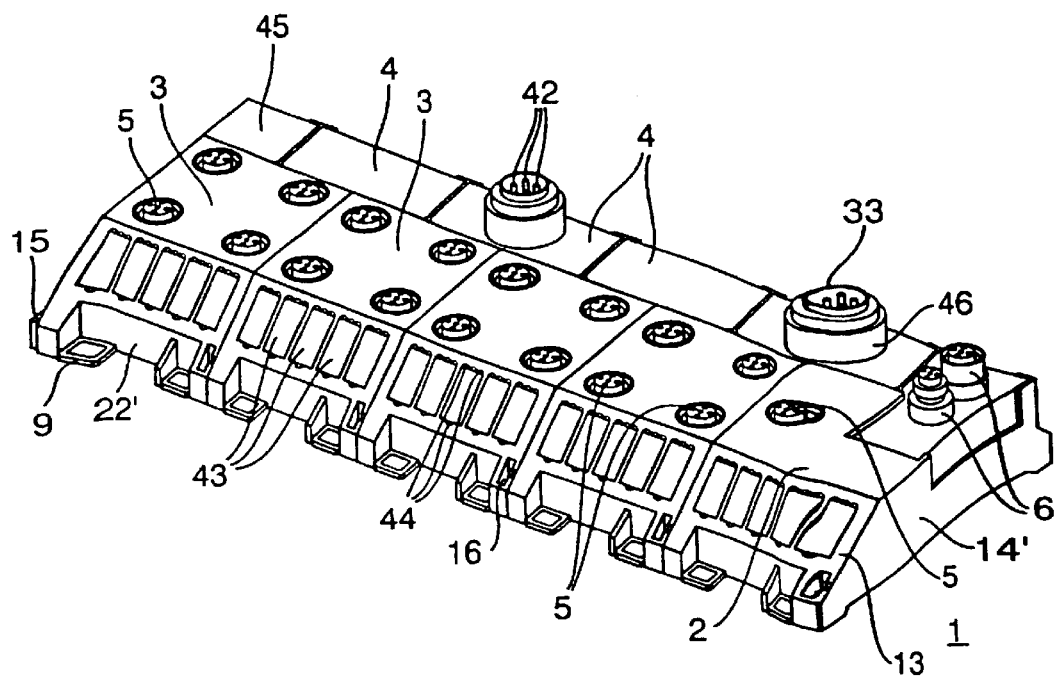
FIG. 1 shows a perspective view of a field bus subscriber unit according to the present invention.

A field bus subscriber unit 1, as shown in FIG. 1, consists of the field bus terminal module 2 and four I/O (input/output) modules 3 for control and monitoring of actuators and sensors which are not shown, which are electrically connected to one another and to the field bus terminal modules 2 by internal signal and operating voltage lines via bridge elements 4, and have plug-and-socket connections 5 for connection to the actuators and sensors.

The field bus terminal module 2 is connected to the field bus via two connectors 6 and on the one hand relays the sensor signals obtained from the I/O modules 3 via the internal signal lines to the field bus and on the other hand supplies control signals decoupled from the field bus via the I/O modules 3 to the actuators.

The I/O modules 3 have a console-shaped module housing 7 with a bottom 8 and feet 9 and a circuit board 10 which bears the plug-and-socket connections 5 which for their part pass through recesses 11 of the roof surface 12 of the module housing 7 and are somewhat flush with them. All the labeling fields 42 and LED display elements 43 of the modules 2, 3 are located on the console surface 13.

The module housing 7 and the field bus terminal module 2 on one side wall 14 have two projections 15 which are T-shaped in cross section and in the opposite side wall 14' of the I/O modules 3, guide slots 16 which are open to the top and which are matched thereto. By inserting the projections 15 of the module housing 7 into the guide slots 16 of the adjacent module housing 7 the I/O modules 3 and the field bus terminal module 2 can be juxtaposed to one another by hand.

Figure 4:
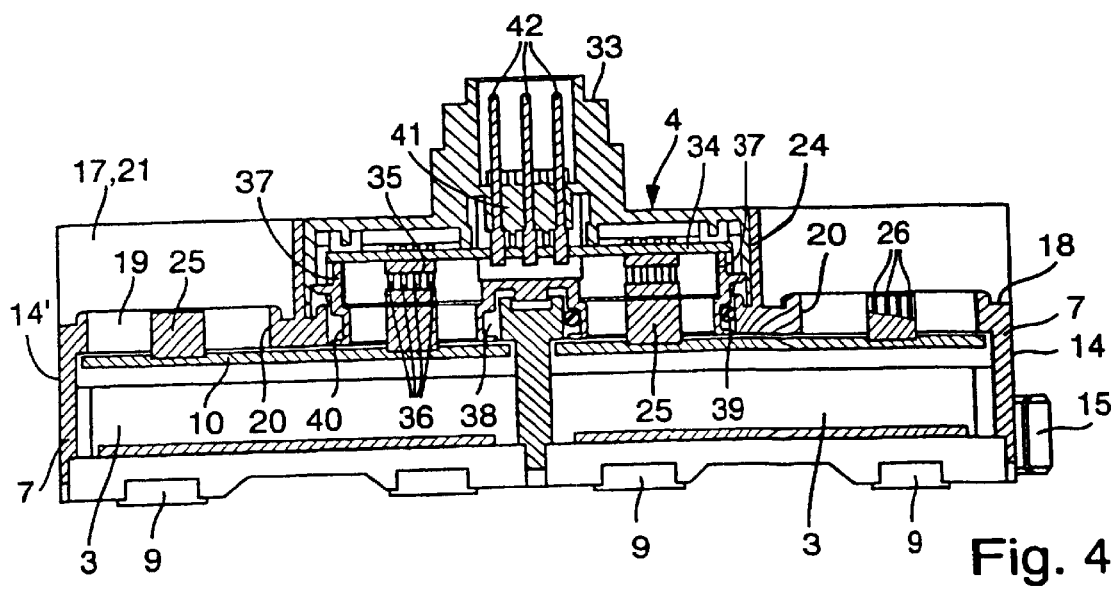

On the end face opposite the console surface 13 the module housing 7 has a shoulder 17 (see FIG. 4); in its base surface 18 there are two collar-shaped penetrations 19 with a cylindrical wall 20. In the middle between the penetrations 19 of each module 3, between the end face 21 of the shoulder 17 and a crosspiece 23 which is flush with the terminal-side end face 22 of the module housing 7 there is a partition 24, the height of the crosspiece 23 and the partition 24 corresponds to that of the end face 21.

Figure 2:
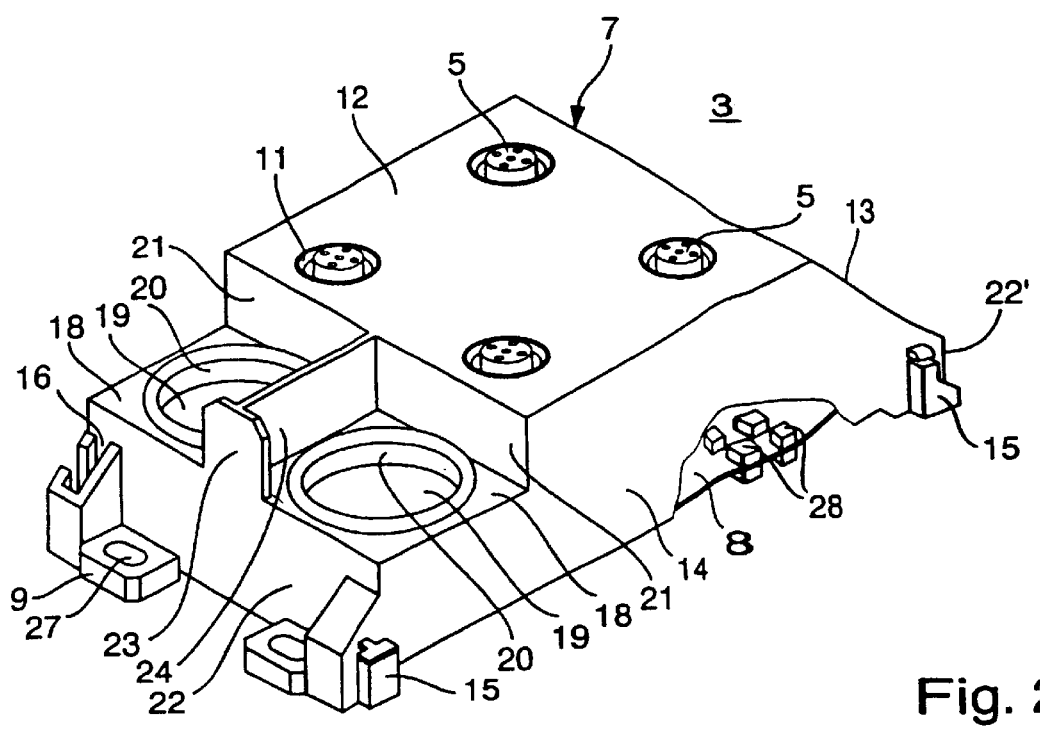
FIG. 2 shows a perspective view of an individual module without visible mating connectors.
Figure 3A:
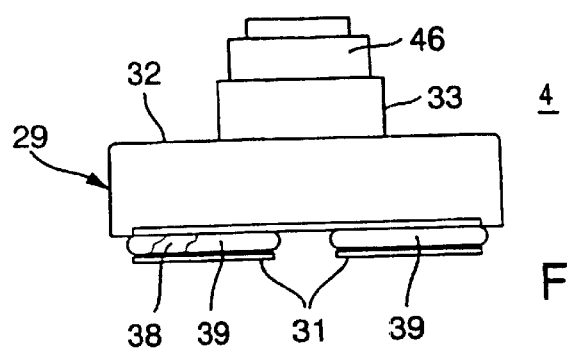
FIG. 3 shows a side view (FIG. 3a), a plan view of the feed side (FIG. 3b) and a plan view of the plug side (FIG. 3c) of a bridge element; and, FIG. 4 shows a section view through two modules connected to the bridge element.
Figures 3B, 3C:
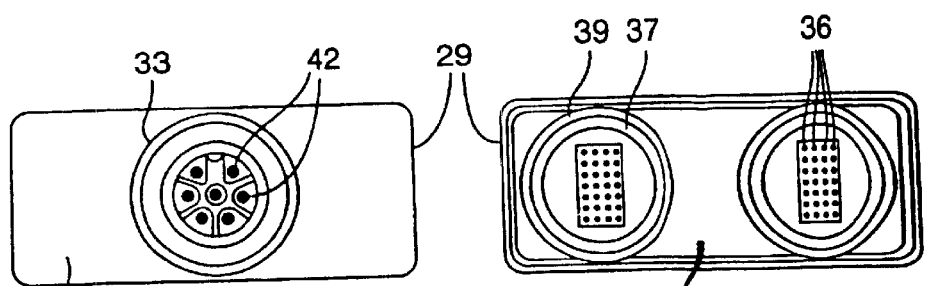

On the circuit board 10 there are two contact carriers 25 which are not shown in FIG. 2, with twenty eight receptacles 26 each (see FIG. 4), which are connected to the pertinent terminal points or printed conductors of the circuit board 10 and are positioned in the area of the penetrations 19.

The feet 9 which have elongated holes 27 for optionally required screw attachment of the module housings 7 project from the bottom of the housing 7 so that between the housing bottom 8 and the installation surface there is an intermediate space in which an air flow forms, by which the lost heat forming in the encapsulated I/O modules 3 and the field bus terminal module 2 is largely dissipated. This advantageous action is intensified by the housing bottom 8 being made trough-shaped, its tapering toward the end faces of the modules 2, 3 and having domes 28 which are arranged in a grid; as a result of their large surface a large amount of heat can be dissipated.

The bridge elements 4 each have a cuboidal housing body 29 and two 28-pin connectors provided on the base surface 30, their center distance and that between the penetrations 19 of the two adjacent I/O modules 3, which penetrations face one another, are the same. In two of the four bridge elements 4 there are moreover 6-pin connector sockets 33.

The dimensions of the housing bodies 29 correspond to those of the space between the partitions 24 of two adjacent modules 2, 3 and between the crosspieces 23 and the end faces 21 of the shoulder 17, the cover surfaces 32 being flush with the roof surfaces 12 of the module housing 7 when the bridge elements 4 are inserted.

The connectors 31 each consist of a carrier 35 which is integrated with a card 34 for holding the twenty eight plug pins 36 which correspond to the receptacles 26 and an essentially cylindrical outside sleeve 37 which encompasses them and which bears an O-shaped gasket 39 in the annular depression 38 of the jacket surface.

The inside wall 40 of the depression 38 and the penetration wall 20 parallel to it in the module housing 7 are tilted at an angle of roughly 10° to the plug axis. The tilt causes a force component in the insertion direction so that together with the corresponding dimensioning of the mutual distance of the contact surfaces 20, 40 and of the gasket 39 and its material properties, a high withdrawal force of roughly 15 kg is reached overall, by which installation of the field bus subscriber unit 1 is enabled even on highly vibrating surfaces, for example of machines, without additional fastening devices.

The connector sockets 33 each have six contact pins 42 which are held in an insulating part 41, which are soldered on the card with continuing printed conductors, and which are encompassed by a collar 46 which projects to the outside and which is integral with the housing body 29 and the insulating part 41.

In assembling the field bus subscriber unit 1, first the field bus terminal module 2 and the I/O modules 3 are juxtaposed to one another by inserting the T-shaped projections 15 which are attached to the side walls 14 until they pass into the guide slots 16 located on the side walls 14' and if necessary are screwed with the feet 9 to the installation surface.

In this way, the module housings 7 are detachably fastened to one another in the set position, by exact, almost play-free guidance especially the exact theoretical distance of the penetrations 19 of adjacent module housings 7, that is, the penetrations facing one another, being aligned so that the connectors 31 cannot tilt when the bridge elements 4 are subsequently inserted into the mating connectors 25, 26 or cannot be inserted obliquely to the plug axes. In this way, the gaskets 38 are pressed on the entire periphery uniformly against the walls 20 of the penetrations 19, by which the maximum sealing action is always achieved.

When the I/O module 3 is located on the end of the field bus subscriber unit 1 the last mating connector which is not further connected by a bridge element is covered by a blind cap 45.

The internal signal lines (printed conductors on the circuit boards 10) which are connected to the plug-and socket connections 5 of the actuators and sensors are guided through the I/O modules 3 via the receptacles 26 of the mating connectors, the plug pins 36 of the connectors 31 and the printed conductors on the circuit board 10 and the card 34, and are supplied to the field bus terminal module 2.

Two of the four I/O modules 3 have a connector socket 33 by which the operating voltage especially for the actuators is supplied via one of the connectors 31 of the bridge elements 4 to two separate actuator circuits which each encompass two I/O modules 3 and which can thus be disconnected separately in case of emergencies.

The contact pins 42 of the connector sockets 33 are designed for currents of 8 Amperes (A) in this case. For their undisrupted routing to the actuators several printed conductors on the card 34 and the circuit board 10 as well as several of the thinner plug pins 36 and receptacles 26 are connected in parallel.

Finally, the sensors and actuators are connected to the plug-and-socket connections 5 of the field bus terminal module 2 and the I/O modules 3, and the field bus terminal module 2 is connected to the field bus using the connectors 6. With this simple and prompt installation the field bus subscriber unit 1 is serviceable. Replacement of modules in the field bus subscriber unit 1 of the present invention is also especially easily possible, for example in a case of service or to adapt the entire unit to altered requirements, in contrast to the apparatus unit known from DE 296 97 525 U1, regardless of the location of the individual module in the entire combination. Simply by withdrawing two bridge elements 4 (in the last I/O module 3 of the unit only one bridge element 4) by hand and optionally loosening the screw connections on the module feet 9 any individual module can be removed from the combination and equally promptly replaced.

What is claimed is:

1. Electrical bus apparatus having a plurality of plug-and-socket connectors, said electrical apparatus comprising:

at least two juxtaposable modules, each juxtaposable module having (i) a module housing, (ii) at least one plug-and-socket connector, and (iii) at least one mating connector;

at least one bridge element interconnected to said two juxtaposable modules to transmit electrical signals and operating voltages, said bridge element having two bridge connectors, each of said bridge connectors being connected to one of said mating connectors of said two juxtaposable modules; and, each of said module housings having at least one cylindrical recess with a mating connector disposed in said cylindrical recess, and each bridge connector having an essentially cylindrical outside sleeve with an O-shaped gasket disposed in an annular depression that is disposed about a periphery of said cylindrical outside sleeve with said O-shaped gasket under pressure contacting a gasket contact wall of said cylindrical recess.

2. Electrical apparatus as claimed in claim 1, wherein each cylindrical outside sleeve is integral with the bridge element.

3. Electrical apparatus as claimed in claim 1, wherein the gasket contact walls of the cylindrical recesses are essentially parallel to the annular depressions, and said gasket contact walls are tilted from a connector axis.

4. Electrical apparatus as claimed in claim 1, wherein the module housing includes a shoulder extending from a base surface to a height from said base surface that corresponds to that of a housing body of the bridge element interconnected to said module.

5. Electrical apparatus as claimed in claim 1, wherein the plug-and-socket connectors are countersunk in each module housing with an upper surface for each plug-and-socket connector being about flush with a roof surface of said module housing.

6. Electrical apparatus as claimed in claim 1, wherein each of said module housings includes:
a first opposite side wall and a second opposite side wall;
at least one T-shaped projection extending from said first opposite side wall;
at least one guide slot having an opening extending toward a roof surface of the module housing, and said guide slot extending from said second opposite side wall; and
said two juxtaposable modules interconnected by said T-shaped projection extending from a first of said two juxtaposable modules being disposed into the opening of said guide slot extending from a second of said two juxtaposable modules.

7. Electrical apparatus as claimed in claim 1, wherein each of the module housings includes at least one labeling field and at least one display element, both mounted on an inclined surface of said module housing.

8. Electrical apparatus as claimed in claim 1, wherein at least two feet extend from each of the module housings, and each of said feet has a support surface disposed for resting on an installation surface, said support surfaces further being disposed at a distance away from a housing bottom of said module housing.

9. Electrical apparatus as claimed in claim 1, wherein each of the juxtaposable modules includes one circuit board from which a mating connector is disposed and to which plug-and-socket connectors are electrically connected.

10. Electrical apparatus as claimed in claim 1, wherein the bridge element has an additional connector socket disposed for connection to an operating voltage source.

11. Electrical apparatus as claimed in claim 4, wherein the module housing further includes a partition and a crosspiece that both extend away from said base surface with said partition extending transverse from said shoulder and said crosspiece extending transverse from said partition, said crosspiece having a surface that is flush with a terminal-side end face of the module housing, the heights of both the crosspiece and the partition from the base surface being about that of the shoulder.

12. Electrical apparatus as claimed in claim 11, wherein the crosspiece and the partition are integral with the module housing.

13. Electrical apparatus as claimed in claim 9, wherein the circuit board is press fit into the module housing.

14. Electrical apparatus as claimed in claim 10, wherein the bridge element includes conductors for transmission of the operating voltage, said conductors being routed and connected to only one bridge connector.

15. Electrical apparatus as claimed in claim 8, wherein the feet are integral with the module housing, and each foot includes an opening with a mounting screw disposed in said opening.

16. Electrical apparatus as claimed in claim 15, wherein the housing bottom is trough-shaped and tapers toward two opposite end faces of the module housing.

17. Electrical apparatus as claimed in claim 16, wherein the housing bottom includes multiple domes arranged in a grid.

18. Electrical apparatus as claimed in claim 17, wherein the domes are integral with the housing bottom.

19. Electrical apparatus as claimed in claim 17, wherein the domes are tubular shaped.

20. Electrical apparatus as claimed in claim 19, wherein the domes are integral with the housing bottom.

21. Electrical bus apparatus having a plurality of plug-and-socket connectors, said electrical apparatus comprising:
at least two juxtaposable modules, each juxtaposable module having (i) a module housing, (ii) at least one plug-and-socket connector, and (iii) at least one mating connector;
at least one bridge element interconnected to said two juxtaposable modules to transmit electrical signals and operating voltages, said bridge element having two bridge connectors, each of said bridge connectors being connected to one of said mating connectors of said two juxtaposable modules; and,
said bridge element having two cylindrical recesses with a bridge connector disposed in each of said cylindrical recesses, and each mating connector having an essentially cylindrical outside sleeve with an O-shaped gasket disposed in an annular depression that is disposed about a periphery of said cylindrical outside sleeve with said O-shaped gasket under pressure contacting a gasket contact wall of said cylindrical recess.

22. Electrical apparatus as claimed in claim 21, wherein each cylindrical outside sleeve is integral with the module housing.

23. Electrical apparatus as claimed in claim 21, wherein the gasket contact walls of the cylindrical recess are essentially parallel to the annular depressions, and said gasket walls are tilted from a connector axis.

24. Electrical apparatus as claimed in claim 21, wherein the module housing includes a shoulder extending from a base surface to a height from said base surface that corresponds to that of a housing body of the bridge element interconnected to said module.

25. Electrical apparatus as claimed in claim 21, wherein the plug-and-socket connectors are countersunk in each module housing with an upper surface for each plug-and-socket connector being about flush with a roof surface of said module housing.

26. Electrical apparatus as claimed in claim 21, wherein each of said module housings includes:
a first opposite wall and a second opposite wall;
at least one T-shaped projection extending from said first opposite side wall;
at least one guide slot having an opening extending toward a roof surface of the module housing, and said guide slot extending from said opposite side wall; and
said two juxtaposable modules interconnected by said T-shaped projection extending from a first of said two juxtaposable modules being disposed into the opening of said guide slot extending from a second of said two juxtaposable modules.

27. Electrical apparatus as claimed in claim 21, wherein each of the module housings includes at lest one labeling field and at least one display element, both mounted on an inclined surface of said module housing.

28. Electrical apparatus as claimed in claim 21, wherein at least two feet extend from each of the module housings, and each of said feet has a support surface disposed for resting on an installation surface, said support surfaces further being disposed at a distance away from a housing bottom of said module housing.

29. Electrical apparatus as claimed in claim 33, wherein the housing bottom is trough-shaped and tapers toward two opposite end faces of the module housing.

30. Electrical apparatus as claimed in claim 21, wherein each of the juxtaposable modules includes one circuit board from which a mating connector is disposed and to which plug-and-socket connectors are electrically connected.

31. Electrical apparatus as claimed in claim 21, wherein the bridge element has an additional connector socket disposed for connection to an operating voltage source.

32. Electrical apparatus as claimed in claim 24, wherein the module housing further includes a partition and a crosspiece that both extend away from said base surface with said partition extending transverse from said shoulder and said crosspiece extending transverse from said partition, said crosspiece having a surface that is flush with a terminal-side end face of the module housing, the heights of both the crosspiece and the partition from the base surface being about that of the shoulder.

33. Electrical apparatus as claimed in claim 28, wherein the feet are integral with the module housing, and each foot includes an opening with a mounting screw disposed in said opening.

34. Electrical apparatus as claimed in claim 29, wherein the housing bottom includes multiple domes arranged in a grid.

35. Electrical apparatus as claimed in claim 30, wherein the circuit board is press fit into the module housing.

36. Electrical apparatus as claimed in claim 31, wherein the bridge element includes conductors for transmission of the operating voltage, said conductors being routed and connected to only one bridge connector.

37. Electrical apparatus as claimed in claim 32, wherein the crosspiece and the partition are integral with the module housing.

38. Electrical apparatus as claimed in claim 34, wherein the domes are tubular shaped.

39. Electrical apparatus as claimed in claim 34, wherein the domes are integral with the housing bottom.

40. Electrical apparatus as claimed in claim 38, wherein the domes are integral with the housing bottom.

* * * * *